United States Patent
Chuang et al.

(10) Patent No.: US 8,624,311 B2
(45) Date of Patent: Jan. 7, 2014

(54) METHOD AND STRUCTURE TO REDUCE DARK CURRENT IN IMAGE SENSORS

(76) Inventors: Chun-Chieh Chuang, Hsin-Chu (TW); Chih-Min Lin, Hsinchu (TW); Ken Wen-Chien Fu, Hsinchu (TW); Dun-Nian Yaung, Taipei (TW)

(*) Notice: Subject to any disclaimer, the term of this patent is extended or adjusted under 35 U.S.C. 154(b) by 0 days.

(21) Appl. No.: 13/238,248

(22) Filed: Sep. 21, 2011

(65) Prior Publication Data

US 2012/0007156 A1    Jan. 12, 2012

Related U.S. Application Data

(62) Division of application No. 11/733,514, filed on Apr. 10, 2007, now Pat. No. 8,030,114.

(60) Provisional application No. 60/887,378, filed on Jan. 31, 2007.

(51) Int. Cl.
*H01L 31/113* (2006.01)

(52) U.S. Cl.
USPC .................. 257/293; 257/292; 257/E31.127; 438/59

(58) Field of Classification Search
USPC ........ 257/292, 293, E31.127, E21.04; 438/59
See application file for complete search history.

(56) References Cited

U.S. PATENT DOCUMENTS

| | | | |
|---|---|---|---|
| 6,180,969 B1 * | 1/2001 | Yang et al. | 257/291 |
| 6,642,076 B1 * | 11/2003 | Yaung et al. | 438/48 |
| 6,894,268 B2 | 5/2005 | Ohkawa | |
| 6,908,839 B2 | 6/2005 | Rhodes | |
| 7,345,308 B2 | 3/2008 | Sakano et al. | |
| 7,345,330 B2 * | 3/2008 | Rhodes | 257/292 |
| 7,402,451 B2 | 7/2008 | Rhodes | |
| 8,017,944 B2 * | 9/2011 | Yamazaki et al. | 257/59 |
| 8,169,011 B2 * | 5/2012 | Oh | 257/292 |
| 8,184,225 B2 * | 5/2012 | Tomiyasu | 349/43 |
| 8,298,846 B2 * | 10/2012 | Mouli et al. | 438/48 |
| 2005/0001277 A1 | 1/2005 | Rhodes | |
| 2006/0125007 A1 * | 6/2006 | Rhodes | 257/346 |
| 2008/0083938 A1 | 4/2008 | Liang et al. | |
| 2008/0105944 A1 | 5/2008 | Chang et al. | |
| 2008/0188029 A1 | 8/2008 | Rhodes | |
| 2010/0201859 A1 * | 8/2010 | Mouli et al. | 348/308 |

OTHER PUBLICATIONS

Chinese Patent Office, Office Action dated Jan. 22, 2010, Application No. 2008100092559, 6 pages.

* cited by examiner

*Primary Examiner* — Allan R Wilson
(74) *Attorney, Agent, or Firm* — Haynes and Boone, LLP

(57) ABSTRACT

A method to fabricate an image sensor includes providing a semiconductor substrate having a pixel region and a periphery region, forming a light sensing element on the pixel region, and forming at least one transistor in the pixel region and at least one transistor in the periphery region. The step of forming the at least one transistor in the pixel region and periphery region includes forming a gate electrode in the pixel region and periphery region, depositing a dielectric layer over the pixel region and periphery region, partially etching the dielectric layer to form sidewall spacers on the gate electrode and leaving a portion of the dielectric layer overlying the pixel region, and forming source/drain (S/D) regions by ion implantation.

18 Claims, 9 Drawing Sheets

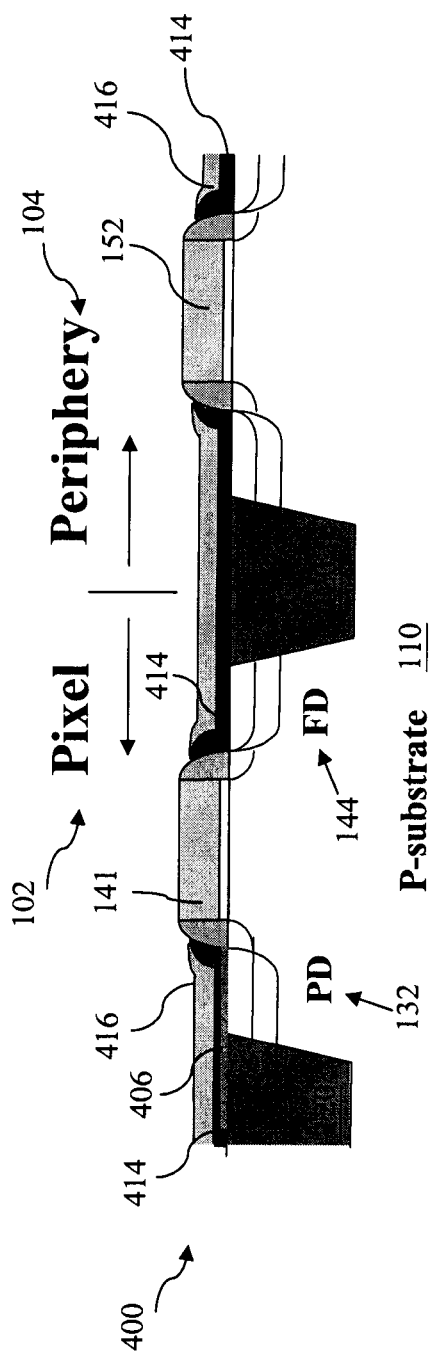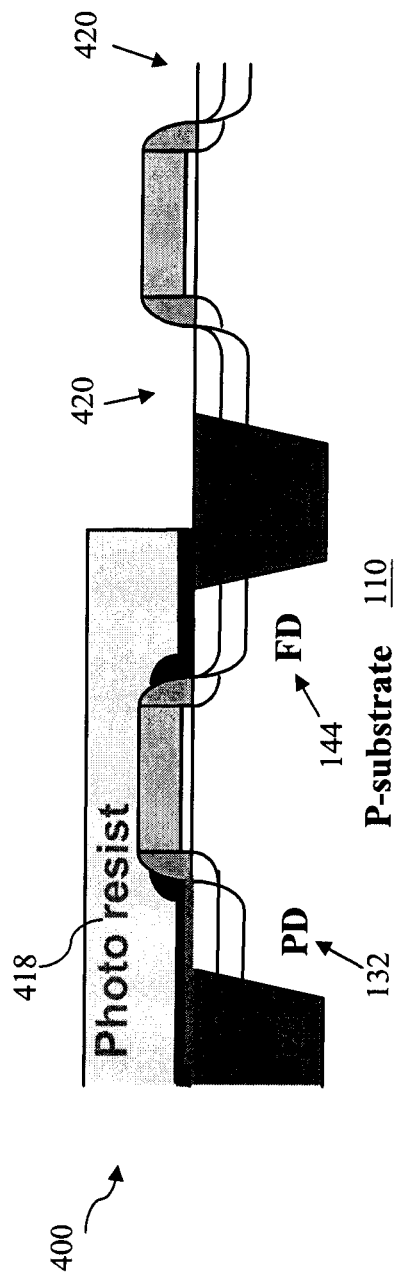

METHOD AND STRUCTURE TO REDUCE DARK CURRENT IN IMAGE SENSORS

PRIORITY DATA

This application claims the priority under 35 U.S.C. §119 of U.S. Provisional Application Ser. No. 60/887,378 entitled "METHOD AND STRUCTURE TO REDUCE DARK CURRENT IN IMAGE SENSOR" filed on Jan. 31, 2007, and is a divisional of U.S. application Ser. No. 11/733,514, filed Apr. 10, 2007, the latter of which is incorporated herein by reference in its entirety.

BACKGROUND

The present disclosure relates generally to image sensors and, more particularly, to complementary metal-oxide-semiconductor (CMOS) image sensors.

In semiconductor technologies, image sensors are used for sensing a volume of exposed light projected towards a semiconductor substrate. Complementary metal-oxide-semiconductor (CMOS) image sensors (CIS) and charge-coupled device (CCD) sensors are widely used in various applications such as digital still camera applications. These devices utilize an array of pixels or image sensor elements, including photodiodes and transistors, to collect photo energy to convert images into electrical signals.

However, image sensor devices suffer from dark current. That is, unwanted current generated by pixels in the absence of illumination. There may be different sources of dark current such as impurities in the silicon wafer, damage to the silicon crystal lattice by processing techniques, and heat build up in the pixel area. Excessive dark current may lead to image degradation and poor device performance.

Therefore, what is needed is a simple and cost-effective device and method for reducing dark current in image sensors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5G are cross-sectional views of an image sensor being processed according to the method of FIG. 4.

DETAILED DESCRIPTION

Figure 1:
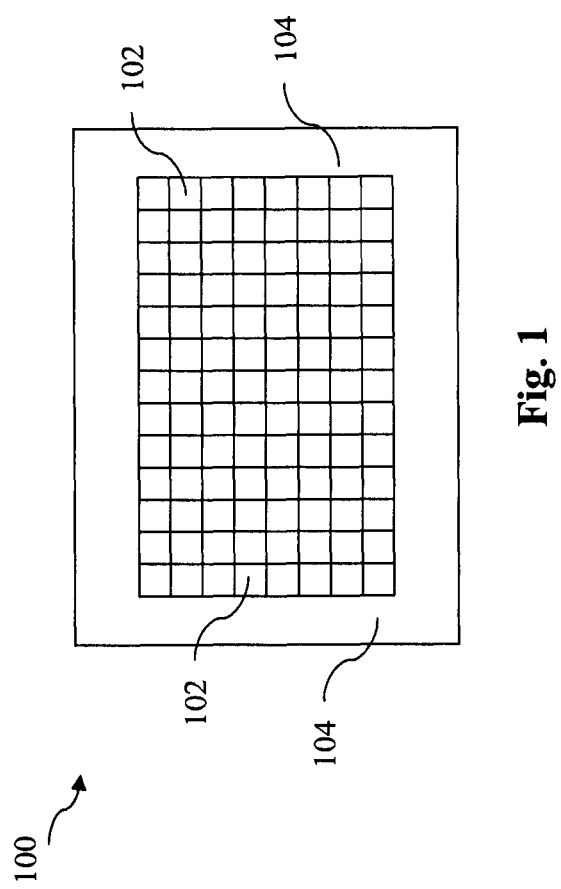
FIG. 1 is a top view of an image sensor including a plurality of pixels according to one or more embodiments of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring now to FIG. 1, illustrated is a top view of an image sensor 100 including a grid or array of pixels 102 (sometimes referred to as image sensor elements). Additional circuitry and input/outputs are typically provided in a periphery region 104 adjacent to the grid of pixels 102 for providing an operation environment for the pixels and for supporting external communications with the pixels. The image sensor 100 may include a charge-coupled device (CCD) sensor, complimentary metal oxide semiconductor (CMOS) image sensor (CIS), an active-pixel sensor, and a passive-pixel sensor. Additionally, the image sensor 100 may be a front-side or back-side illuminated sensor.

Figure 2:
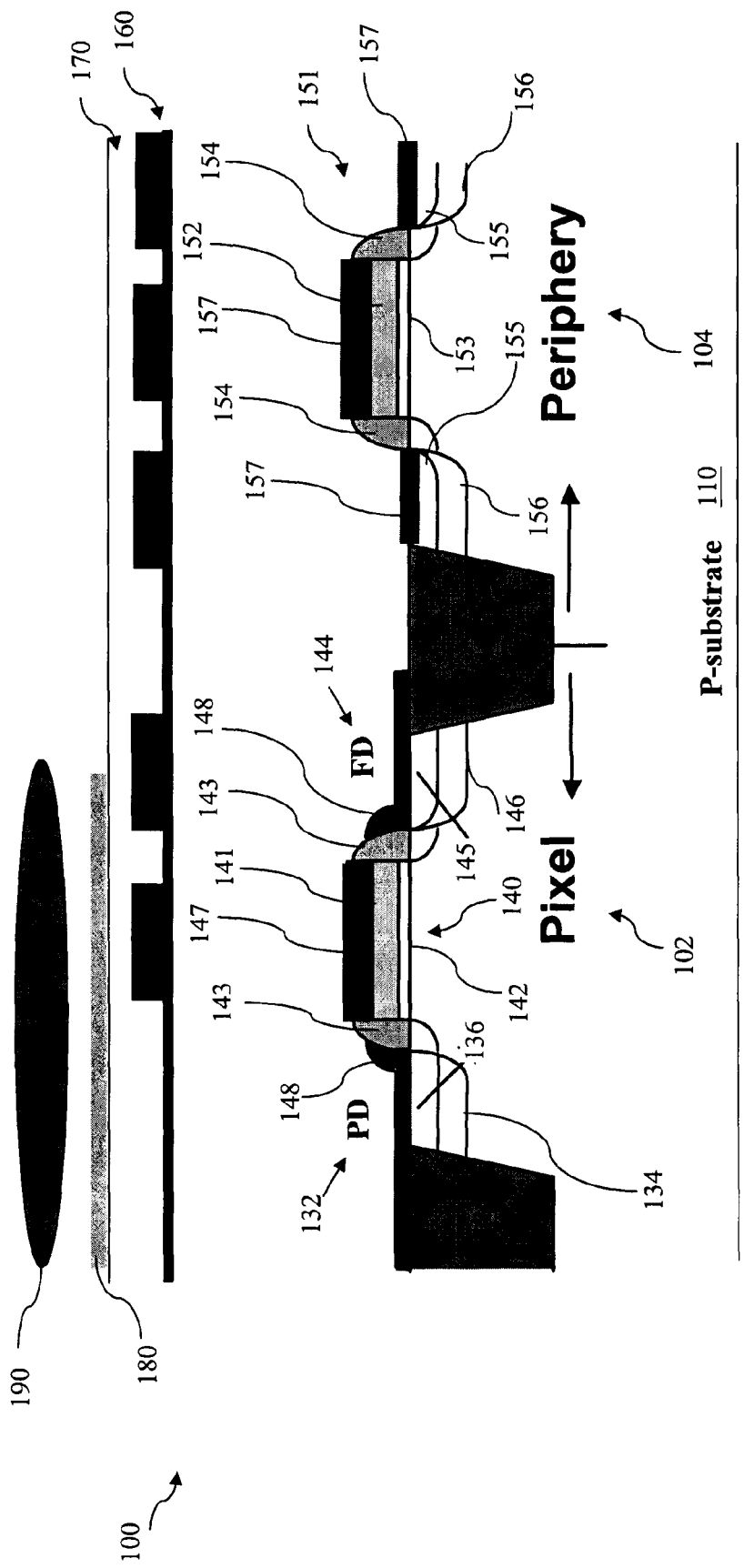
FIG. 2 is a cross-sectional view of an image sensor having an active pixel sensor configuration.

Referring now to FIG. 2, illustrated is a cross-sectional view of the image sensor 100. The image sensor 100 may be fabricated by CMOS processing techniques known in the art. The image sensor 100 may comprise a semiconductor substrate 110. The substrate 110 may include a silicon substrate in a crystalline structure. The substrate 110 may also include other elementary semiconductors such as germanium. Alternatively, the substrate 110 may optionally include a compound semiconductor such as silicon carbide, gallium arsenic, indium arsenide, and indium phosphide. In the present embodiment, the substrate 110 may include a P-type silicon substrate (P-substrate). The P-substrate may be formed by heavily doping the silicon with a P-type dopant, such as boron, $BF_2$, or other suitable material. The doping may be implemented by an ion implantation or a diffusion process known in the art. The substrate 110 may include a P-type epilayer (P-epilayer) (not shown). The P-epilayer may be formed by an epitaxial growth process. The P-epilayer may be configured to have a lower concentration of the P-type dopant than the P-substrate.

The image sensor 100 may further comprise a plurality of isolation features 120 such as shallow trench isolation (STI) features. The isolation features 120 may define and isolate active regions for various microelectronic devices of the image sensor 100. The isolation features 120 may be formed in the P-epilayer by a suitable process known in the art. For example, the STI features may be formed by patterning the P-epilayer by photolithography, etching the P-epilayer by plasma etching to form various trenches, and filling the trenches with a dielectric material such as silicon oxide. The STI features may further include an oxide layer lining the side walls. Additionally, a guard-ring well may be formed substantially underlying each of the STI features.

As previously discussed, the image sensor 100 may comprise an array or grid of pixels 102 even though one exemplary pixel is shown for simplicity and clarity. The image sensor 100 may be configured as an active-pixel sensor wherein each pixel includes a light sensing element and a number of transistors. The pixel 102 may be configured to absorb light radiation and generate optical charges or photo-electrons that are collected and accumulated in a light sensing region of the light sensing element. The transistors may be configured to readout the generated photo-electrons and convert them into an electrical signal.

The pixel 102 may include a photodiode (PD) 132 for sensing an amount of light radiation directed towards the pixel 102. In the present embodiment, the photodiode 132 is an N-type photodiode. The photodiode 132 may comprise of an N-type doped region 134 formed in the P-epilayer. The N-type doped region 134 may be formed by ion implantation with an N-type dopant such as phosphorus, arsenic, or other suitable material. The photodiode 132 may further include a heavily doped P-type region 136 (also referred to as P-type pinned layer) formed on the surface of the N-type doped region 134. Accordingly, the P-N-P junction region (referred also as the depletion region) makes up the light sensing region of the photodiode 132. Another example of a photodiode that can be used is shown in U.S. patent application Ser. No. 11/291,880, filed on Dec. 1, 2005, which is hereby incorporated by reference. Alternatively, other types of light sensing elements or photo-detectors may optionally be used such as a photo gate and photo transistor.

The pixel 102 may further include at least one transistor 140, such as a transfer gate transistor. The transistor 140 may include a gate electrode 141 and a gate dielectric 142 formed on the substrate 110. The transistor 140 may further include sidewall spacers 143 formed on either side of the gate electrode 141. The transistor 140 may transfer the photo-electrons generated in the light sensing region of the photodiode 132 to a floating node (FD) 144 (also referred to as a floating diffusion). The floating node 144 may include a lightly doped drain (LDD) region 145 and a higher doped source/drain (S/D) region 146. The transistor 140 may further include a metal contact made of a silicide 147, such as titanium silicide, tantalum silicide, nickel silicide, cobalt silicide, or other suitable material, formed over the gate electrode 141. The silicide 147 may promote better adhesion between the silicon and metal conductor that is subsequently formed. The pixel 102 may further include a protective oxide 148 overlying the photodiode (PD) 132 and the floating node (FD) 144. It is understood that pixel 102 may include other various transistors, such a reset gate transistor, source follower transistor, row select transistor, and other types of transistors, depending on the configuration of the pixel. Additionally, the pixel 102 may be configured such that several pixels may share a reset gate transistor and source follower transistor.

The image sensor 100 may further comprise a periphery region 104 configured to provide an operation environment for the pixels 102 and for supporting external communications with the pixels. The periphery region 104 may comprise a plurality of transistors even though one transistor 151 is shown for simplicity and clarity. The transistor 151 may include a gate electrode 152 and a gate dielectric 153 formed on the substrate 110. The transistor 151 may further include sidewall spacers 154 formed on either side of the gate electrode 152. The transistor 151 may further include lightly doped drain (LDD) regions 155 and higher doped source/drain (S/D) regions 156. The transistor 151 may further include metal contacts made of a silicide 157, such as titanium silicide, tantalum silicide, nickel silicide, cobalt silicide, or other suitable material, formed over the gate electrode 152 and the source/drain regions 156. The silicide 157 may promote better adhesion between the silicon and metal conductor that is subsequently formed. It is understood that the transistor 151 may be configured as an N-type MOS (nMOS) transistor or P-type (pMOS) transistor.

The image sensor 100 may further comprise a plurality of interconnect metal layers 160 (one is shown for clarity) for providing connections between the various microelectronic devices of the image sensor. The interconnect metal layers may include conductive materials such as aluminum, aluminum/silicon/copper alloy, titanium, titanium nitride, tungsten, polysilicon, metal silicide, or combinations thereof. The interconnects may be formed by a process including physical vapor deposition (or sputtering), chemical vapor deposition (CVD), or other suitable technique. Alternatively, the interconnect metal layers may include copper, copper alloy, titanium, titanium nitride, tantalum, tantalum nitride, tungsten, polysilicon, metal silicide, or combinations thereof.

The interconnect metal layers may be disposed and insulated in an interlayer dielectric 170. The interlayer dielectric may include a material of a low dielectric constant such as a dielectric constant less than about 3.5. The interlayer dielectric may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, SiLK (Dow Chemical, Midland, Mich.), polyimide, and/or other suitable materials. The interlayer dielectric may be formed by a technique including spin-on, CVD, or sputtering. Additionally, the interconnect metal layer and interlayer dielectric may be formed in an integrated process such as a damascene process or lithography/plasma etching process.

The image sensor 100 may further comprise a color filter 180 and a microlens 190 for filtering and directing light radiation towards the pixel 102 during operation. Even though the color-filter 180 and microlens 190 are shown disposed on the front surface of the substrate 110, it is understood that the location of the color-filter and microlens will depend on whether the image sensor is configured as a front-side or back-side illuminated image sensor. In the disclosed image sensors, the light radiation that may be received during operation may not be limited to visual light (e.g., red, green, blue light), but can be extended to other types of light radiation such as infrared (IR) and ultraviolet (UV) light. Accordingly, the pixels and various other devices may be properly designed and configured for effectively reflecting and/or absorbing the corresponding light radiation beam.

Figure 3:
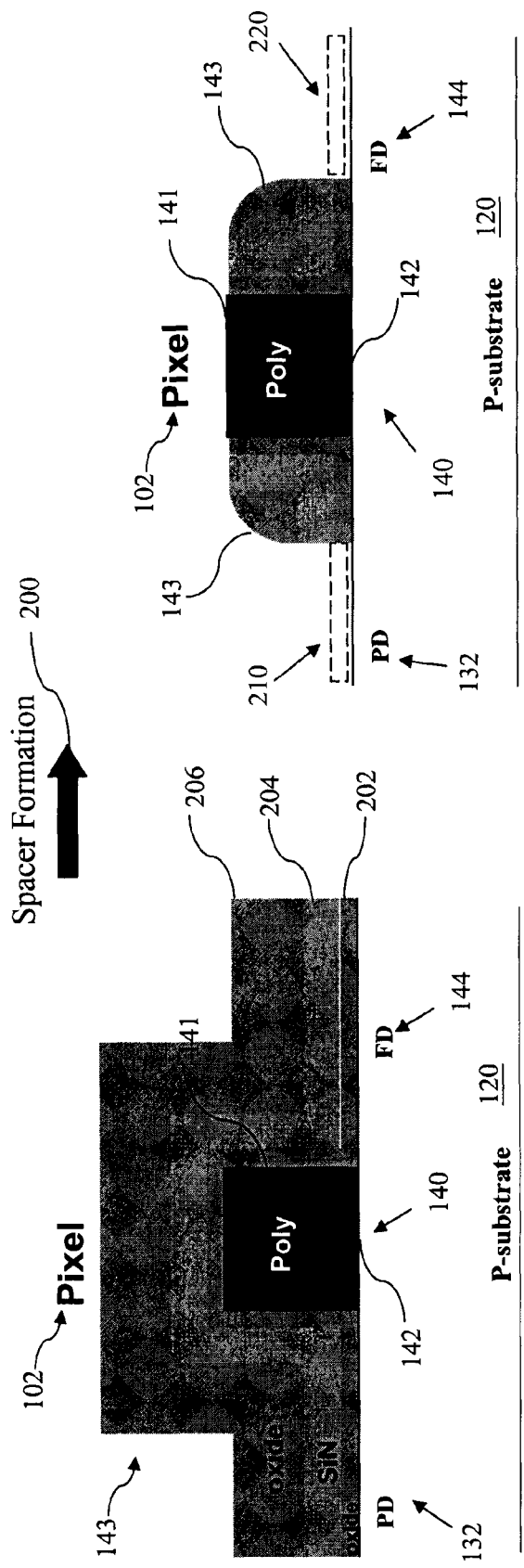
FIG. 3 is a detailed cross-sectional view of a spacer being formed in a pixel region of the image sensor of FIG. 2.

Referring now to FIG. 3, illustrated is detailed cross-sectional view of the sidewall spacer 143 being formed 200 for the transistor 140 of the pixel 102 of FIG. 2. Similar features in FIGS. 2 and 3 are numbered the same for simplicity and clarity. The gate electrode 141 (also referred to as a poly gate) and gate dielectric 142 may be formed on the P-substrate 110 by a dry etch, wet etch, or other suitable process. The lightly doped drain (LDD) region 145 (not shown in FIG. 3) of the floating node (FD) 144 may then be formed by ion implantation. For the sidewall spacer formation, a bottom oxide layer 202 may be deposited across the surface of the substrate 110, followed by a silicon nitride (SiN) layer 204, and followed by a top oxide layer 206. It is understood that other multilayer configurations of dielectric materials may also be used for spacer formation. These layers 202, 204, 206 may be deposited by a chemical vapor deposition (CVD) process or other suitable process. These layers 202, 204, 206 may be etched back using an anisotropic etch process such as a dry etch process. The dry etch process is completed when the polysilicon of the gate electrode 141 is exposed. The spacers 143 may be formed on either side of the gate electrode 141 to prevent the higher source/drain (S/D) implant from penetrating to close to the channel of the transistor 140.

A surface 210 of the photodiode (PD) 132 may be exposed after formation of the spacers 143. A photoresist mask (not shown) may then be formed over this area 210 to protect it from an ion implantation process to form the higher doped source/drain (S/D) region 146 (in FIG. 2) of the floating node (FD) 144. Following ion implantation, the photoresist mask may then be removed by a wet stripping process or other suitable process known in the art. However, it has been observed that wet stripping to remove the photoresist mask can cause damage to the surface 210 of the photodiode (PD) 132. The damage to the surface 210 may increase the dark current of the pixel and thus, may lead to image degradation and poor device performance.

The surface 210 of the photodiode (PD) 132 may be protected by leaving the bottom oxide layer 202 during spacer formation. That is, the bottom oxide layer 202 is not removed when performing the etch back process to form the spacers 143. However, by doing this, the bottom oxide layer 202 will also overlie the area 220 where the higher doped source/drain (S/D) regions will be subsequently formed by ion implantation. Accordingly, the bottom oxide layer 202 may adversely affect the ion implantation process, making the process uncontrollable to precisely form the source/drain (S/D) regions with the required dosage and at the required penetration depth.

Figure 4:
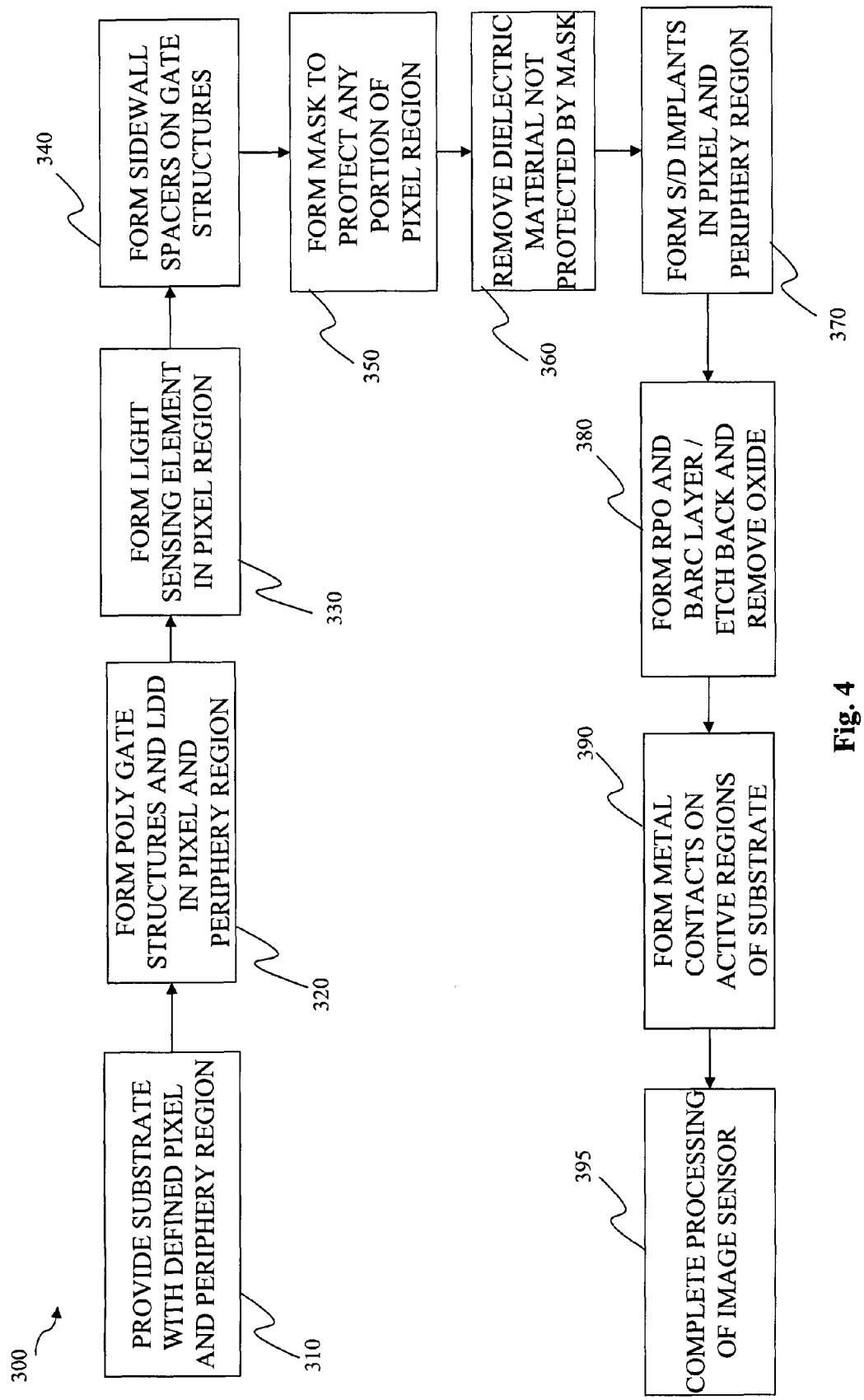
FIG. 4 is a flow chart of a method of fabricating an image sensor according to one or more embodiments of the present disclosure.

Referring now to FIG. 4, illustrated is a flow chart for a method 300 of fabricating an image sensor. Referring also to FIGS. 5A through 5G, illustrated are cross-sectional views of an image sensor 400 being process utilizing the method 300 of FIG. 4. The image sensor 400 may be substantially similar to the image sensor 100 of FIG. 2. Accordingly, similar features in FIGS. 2 and 5A through 5G are numbered the same for simplicity and clarity. The image sensor 400 may be fabricated by CMOS processing techniques known in the art. The image sensor 400 illustrated in FIG. 5A has been through a number of processing steps. These processing steps are known in the art and thus, are not discussed in detail. For example, in FIGS. 4 and 5A, the method 300 begins with step 310 in which a semiconductor substrate 110, such as a P-type silicon substrate (P-substrate), may be provided with defined active regions such as a pixel 102 and periphery region 104. The semiconductor substrate 110 may include an epilayer. The pixel 102 and periphery region 104 may be separated by isolation features 120 formed in the semiconductor substrate 110.

The method 300 continues with step 320 in which poly gate structures for the transistors, such as a gate electrode 141, 152 and gate dielectric 142, 153, may be formed in the active regions of the substrate 110. Step 320 further includes forming lightly doped drain (LDD) regions 145, 155 in the pixel 102 and periphery region 104 by ion implantation. The LDD regions 145, 155 make up part of a source and drain region for the transistors. The type of dopant may depend on whether the transistor is an n-type or p-type.

The method 300 continues with step 330 in which a light sensing element or photo-detector, such as a photodiode (PD) 132, may be formed in the pixel 102. The photodiode 132 may include an N-type photodiode. The photodiode 132 may comprise of an N-type doped region 134 formed in the P-epilayer. The N-type doped region 134 may be formed by ion implantation with an N-type dopant such as phosphorus, arsenic, or other suitable material. The photodiode 132 may further include a heavily doped P-type region 136 (also referred to as P-type pinned layer) formed on the surface of the N-type doped region 134. Accordingly, the P-N-P junction region (referred also as the depletion region) makes up the light sensing region of the photodiode 132. Alternatively, other types of light sensing elements or photo-detectors may optionally be used such as a photogate and photo transistor.

Figure 5A:
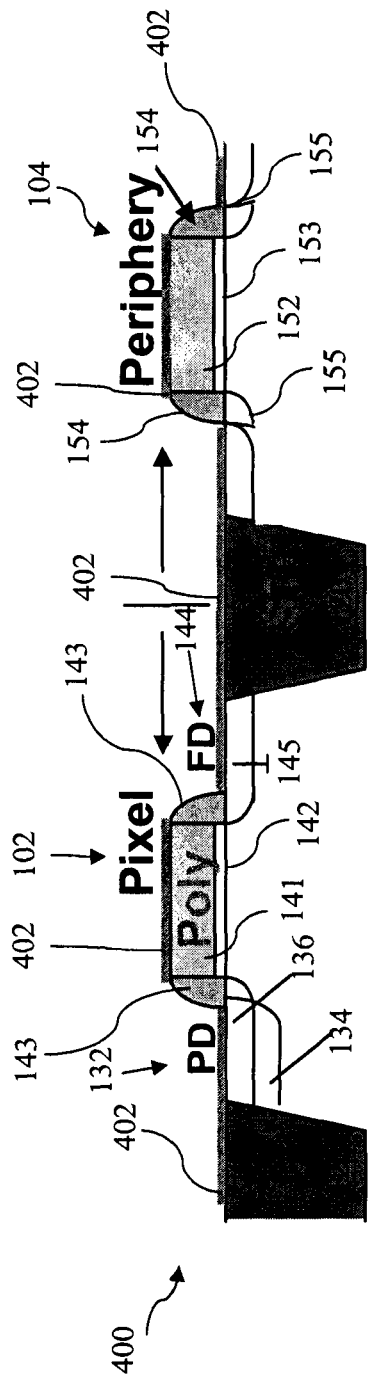

The method 300 continues with step 340 in which sidewall spacers 143, 154 may be formed on the gate electrode 141, 152 by a dry etch process. In FIG. 5A, the image sensor 400 is shown after the formation of the sidewall spacers 143, 154. The spacers 143, 154 may be formed by a similar process as was discussed in FIG. 3. However, a portion 402 of the dielectric layer, such as a bottom oxide layer 202 (in FIG. 3), may not be removed following the dry etch process. The portion 402 of the dielectric layer may overlie the pixel 102 and the periphery region 104.

Figure 5B:
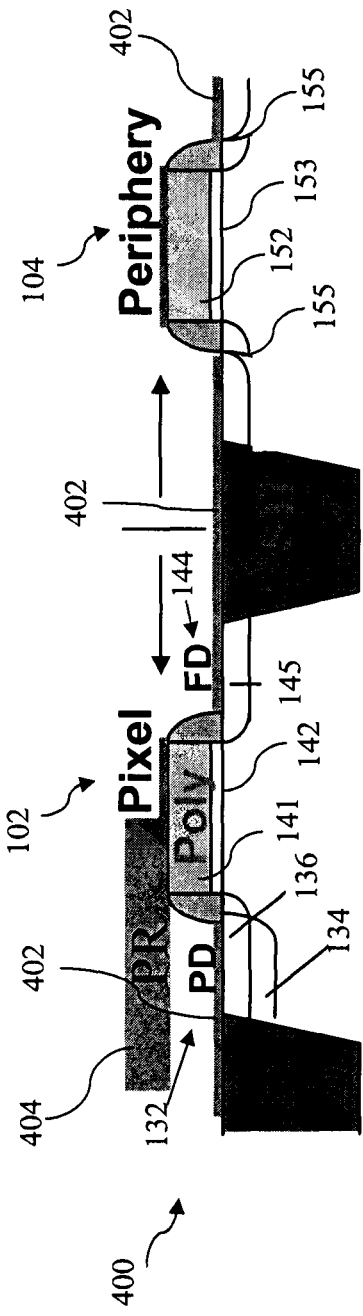
Figure 5C:
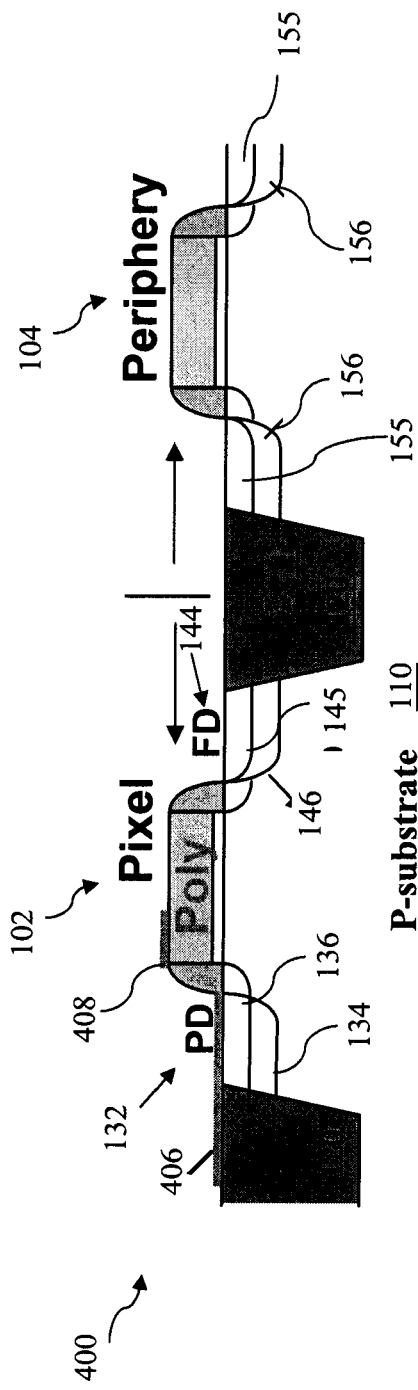
Figure 6A:
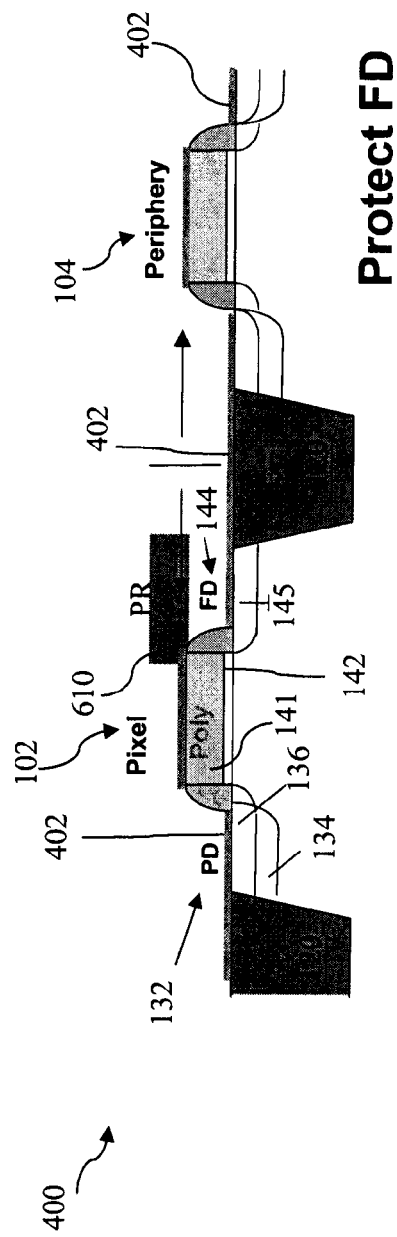
FIGS. 6A-6B are cross-sectional views of other embodiments of an image sensor being processed according to the method of FIG. 4.
Figure 6B:
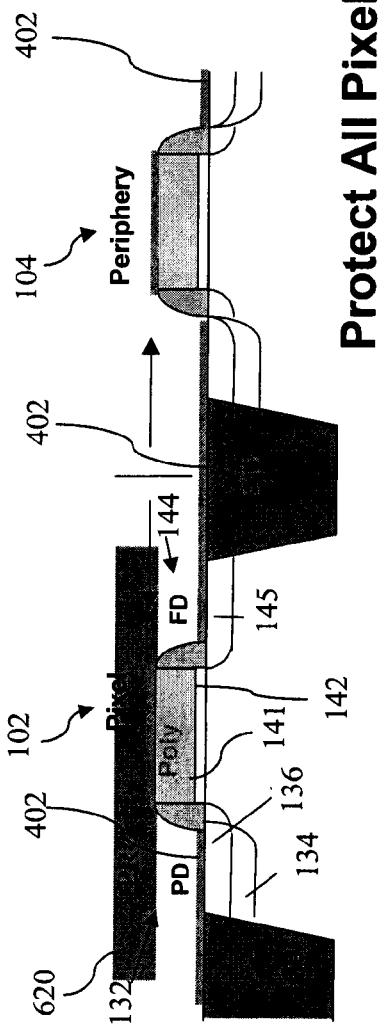

In FIG. 5B, the method 300 continues with step 350 in which a photoresist mask 404 may be formed overlying and protecting a portion of the pixel 102 such as the photodiode (PD) 132 and part of the gate electrode 141. The photoresist mask 404 may be patterned by lithography or other suitable process. The floating node (FD) 144 and the periphery region 104 may be exposed. The portion 402 of the dielectric layer overlying the floating node (FD) 144 and the periphery region 104 may be removed by a dry or wet etching process. The photoresist mask 404 protects the portion 402 of the dielectric layer overlying the photodiode (PD) 132 from being etched. Alternatively, referring to FIG. 6A, a photoresist mask 610 may optionally be formed overlying and protecting other portions of the pixel 102 such as the floating node (FD) 144, source follower (not shown), row select (not shown), other transistors, or combinations thereof. Additionally, referring to FIG. 6B, a photoresist mask 620 may optionally be formed overlying and protecting the entire pixel 102. It is understood that the portion 402 of the dielectric layer protected by the photoresist masks 610, 620 is not etched and the method 300 may continue as described below.

Referring back to FIG. 4 and FIG. 5C, the image sensor 400 is shown after the removal of the portion of the dielectric layer overlying the floating node (FD) 144 and the periphery region 104. A portion 406, 408 of the dielectric layer that was protected by the photoresist mask remains overlying the photodiode (PD) 132 and part of the gate electrode 141 in the pixel region 102. The method 300 continues with step 370 in which higher doped source/drain (S/D) regions 146, 156 may be formed in the pixel 102 and periphery region 104. A photoresist mask (not shown) may be formed over the substrate 110 leaving the areas exposed that define the S/D regions 146, 156. The S/D regions 146, 156 may be formed by ion implantation such that the penetration depth may be slightly beyond the LDD regions 145, 155. The spacers 143, 154 formed in step 340 may prevent the S/D regions 146, 156 from penetrating too close to the channel of the transistors. After ion implantation, the photoresist mask may be removed by wet stripping or other suitable process. The portion 406 of the dielectric layer may protect a surface of the photodiode (PD) 132 from being damaged during wet stripping of the photoresist mask. Accordingly, a dark current generated by the photodiode (PD) 132 in the pixel 102 may be decreased.

Figure 5D:
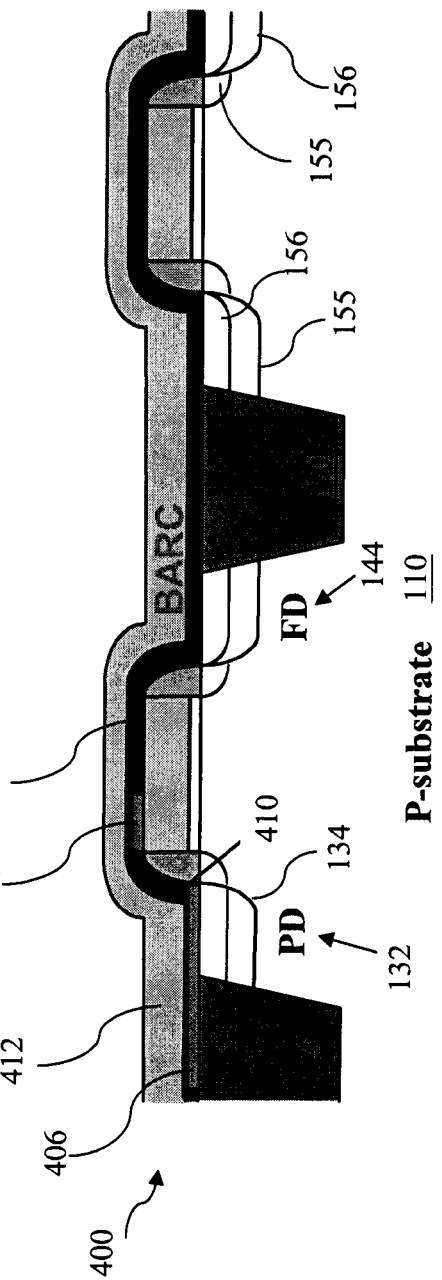

In FIG. 5D, the method 300 continues with step 380 in which a resist protective oxide (RPO) layer 410 may be formed over the semiconductor substrate 110, including the portion 406 of the dielectric layer overlying the photodiode (PD) 132, by a process including physical vapor deposition (or sputtering), chemical vapor deposition (CVD) or other suitable process. The RPO layer 410 may include silicon dioxide, silicon nitride, silicon oxynitride, or other suitable dielectric material. It is understood that the RPO layer may be used to protect some components while other components of the integrated circuit are processed. The step 380 further includes forming a bottom anti-reflecting coating (BARC)

layer 412 over the RPO layer 410. The BARC layer 412 may be formed by a spin coating process. The BARC layer 412 may include an organic material, a nitride material, or an oxide material.

In FIG. 5E, step 380 further includes etching back the RPO layer 410 and BARC layer 412 to remove the oxide from the gate electrode 141, 152 in the pixel 102 and periphery region 104. Following the etching process, a portion 414 of the RPO layer and a portion 416 of the BARC layer may still remain.

If FIG. 5F, a photoresist mask 418 may be formed to protect the pixel 102 and expose the periphery region 104. The portion of the RPO layer and BARC layer 420 overlying the periphery region 104 may be removed by a dry etch process or other suitable process. Following the etching process, the photoresist mask 418 may be removed and the substrate 110 may be cleaned to remove contaminants and oxides from the silicon. The portion of 414 of the RPO layer overlying the photodiode (PD) 132 and floating node (FD) 144 may be used to protect these components while metal contacts may be formed in active areas of the substrate 110.

Figure 5G:
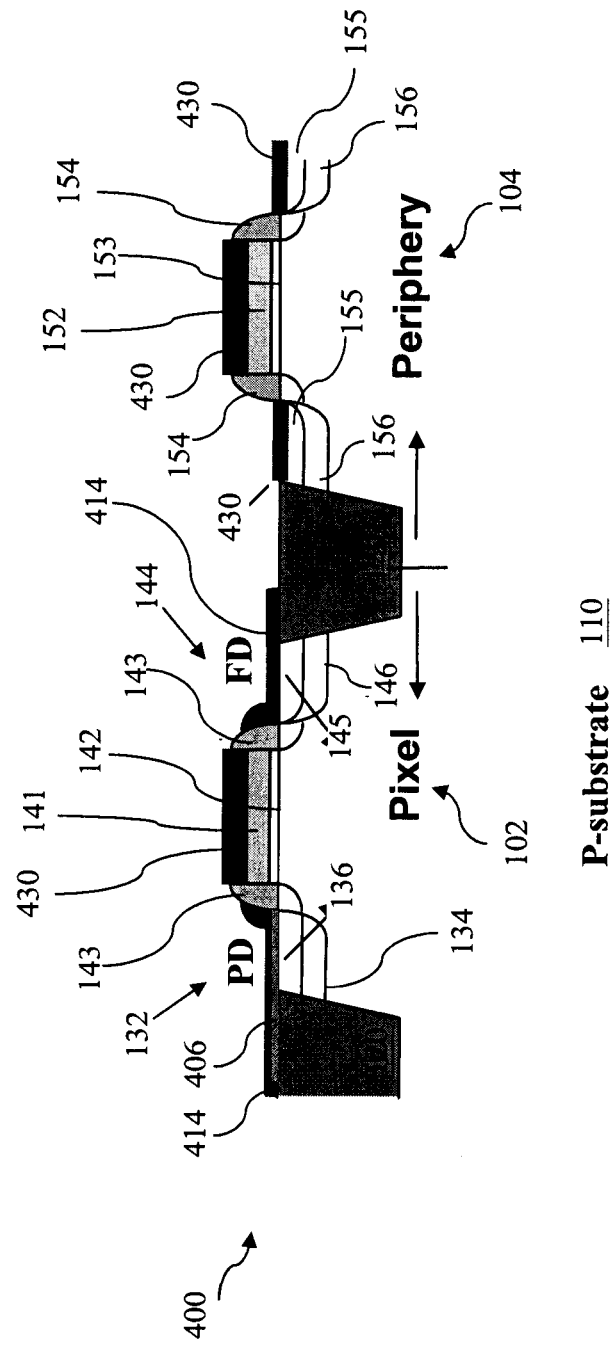

In FIG. 5G, the method 300 continues with step 390 in which metal contacts 430 may be formed in active areas (e.g., source, drain, and gate) of the substrate 110. The metal contacts 430 may promote adhesion between the silicon and metal conductor material that will be deposited later for the interconnects. The metal contacts 430 may include a metal silicide such as titanium silicide, tantalum silicide, nickel silicide, cobalt silicide, or other suitable material. For example, metal contacts 430 formed of titanium silicide may include depositing titanium over the substrate 110 by a physical vapor deposition (PVD) such as sputtering. An annealing process may then be performed so that the titanium overlying active areas of the silicon can react to form titanium silicide. The unreacted titanium may be removed by a wet etching process leaving behind the metal contacts 430 formed of titanium silicide.

The method 300 continues with step 395 in which processing of the image sensor 400 may be completed. Step 395 may include forming metal interconnect layers to connect various microelectronic devices of the image sensor, forming an interlayer dielectric to insulate the metal interconnects, forming a color filter aligned with the pixel region for filtering a desired wavelength of light (e.g., red, green, and blue light), and forming a microlens to direct light radiation towards the pixel region. The color filter and microlens may be formed on a front-side or back-side of the semiconductor substrate 110. These features are well known in the art and, thus are not disclosed in detail here. In the disclosed image sensors and the method to make the same, the light radiation that may be received during operation may not be limited to visible light (e.g., red, green, blue light), but can be extended to other types of light radiation such as infrared (IR) and ultraviolet (UV) light. Accordingly, the pixels and various other microelectronic devices may be properly designed and configured for effectively reflecting and/or absorbing the corresponding light radiation beam.

Thus, the present disclosure provides a method for fabricating an image sensor device. The method includes providing a semiconductor substrate having a pixel region and a periphery region; forming a light sensing element in the pixel region; and forming at least one transistor in the pixel region and at least one transistor in the periphery region. The step of forming the at least one transistor in the pixel region and periphery region includes forming a gate electrode in the pixel region and periphery region; depositing a dielectric layer over the pixel region and periphery region; partially etching the dielectric layer to form sidewall spacers on the gate electrode and leaving a portion of the dielectric layer overlying the pixel region; and forming source/drain (S/D) regions by ion implantation. In some embodiments, the step of forming the light sensing element includes configuring the light sensing element as a type selected from a group consisting of: a photodiode, pinned layer photodiode, photogate, and photo transistor. In other embodiments, the step of forming the at least one transistor includes configuring the at least one transistor as a type selected from a group consisting of: a transfer gate transistor, reset transistor, source follower transistor, row select transistor, nMOS transistor, pMOS transistor, and combinations thereof.

In still other embodiments, the step of depositing the dielectric layer includes depositing a bottom oxide layer over the semiconductor substrate, followed by a silicon nitride layer over the bottom oxide layer. In some other embodiments, the step of depositing the dielectric layer further includes depositing a top oxide layer over the silicon nitride layer. In other embodiments, the step of partially etching the dielectric layer includes: performing an anisotropic etch process to remove the top oxide layer and silicon nitride layer; forming a photoresist mask protecting a first portion of the bottom oxide layer overlying an area of the pixel region; and removing a second portion of the bottom oxide layer not protected by the photoresist mask. In some embodiments, the area of the pixel region includes the light sensing element, a floating node, a source follower, a row select, or combinations thereof. In some other embodiments, the area of the pixel region includes the entire pixel region.

In some other embodiments, the step of forming the at least one transistor further includes removing the photoresist mask by a wet stripping process after the step of forming the source/drain regions by ion implantation. In other embodiments, the step of the providing the semiconductor substrate includes configuring the semiconductor substrate to include a silicon substrate with an epilayer. In still other embodiments, the method further includes the steps of forming a metal interconnect layer and interlayer dielectric layer on the semiconductor substrate; forming a color filter aligned with the light sensing element; and forming a microlens over the color filter. In some embodiments, the method further includes the steps of forming a resist protective oxide (RPO) over the light sensing element; and forming metal contacts for the gate electrode and the source/drain regions of the at least one transistor.

Additionally, the present disclosure provides an image sensor device including a semiconductor substrate having a pixel region and a periphery region; a light sensing element formed in the pixel region; at least one transistor formed in the pixel region and the periphery region having a source/drain (S/D) region; a first oxide layer disposed overlying the light sensing element before formation of the S/D region; and a second oxide layer disposed overlying the first oxide layer after formation of the S/D region. In some embodiments, the light sensing element is selected from a group consisting of: a photodiode, pinned layer photodiode, photogate, and photo transistor. In other embodiments, the at least one transistor is selected from a group consisting of: a transfer gate transistor, reset transistor, source follower transistor, row select transistor, nMOS transistor, pMOS transistor, and combinations thereof.

In still other embodiments, the semiconductor substrate includes a silicon substrate and an epilayer. In other embodiments, the image sensor device further includes an shallow trench isolation (STI) feature for isolating the pixel region and the periphery region; a metal interconnection layer and interlayer dielectric formed on the semiconductor substrate; a color filter aligned with the light sensing element in the pixel region; and a microlens formed over the color filter. In some other embodiments, the first oxide layer is part of a dielectric layer that has been etched back to form sidewall spacers on a gate electrode of the at least one transistor in the pixel and periphery region.

Also, the present disclosure provides a method including the steps of providing a semiconductor substrate having a pixel region and a periphery region; forming a light sensing element in the pixel region; forming a first gate electrode in the pixel region and a second gate electrode in the periphery region; forming a dielectric layer over the pixel region and the periphery region; partially etching the dielectric layer leaving a portion of the dielectric layer overlying the light sensing element; and performing an ion implantation process to form a source/drain region in the pixel region and the periphery region. In some embodiments, the step of forming the light sensing element includes configuring the light sensing element as a type selected from a group consisting of: a photodiode, pinned layer photodiode, photogate, and photo transistor. In other embodiments, the method further includes the step of forming isolation features between the pixel region and the periphery region.

In still other embodiments, the step of partially etching the dielectric layer includes forming sidewall spacers on the first gate electrode and the second gate electrode such that a bottom layer of the dielectric layer is remaining on the substrate; forming a mask to protect the bottom layer that overlies the light sensing element; and removing the bottom layer that is not protected by the mask. In other embodiments, the method further includes the step of stripping the mask to remove the mask after the step of performing the ion implantation process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above listed processing steps can be used in combination or in parallel. Also, features illustrated and discussed in some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure. For example, various features and the doping configurations disclosed herein may be reversed accordingly.

Several different advantages exist from these and other embodiments. In addition to providing an efficient and cost-effective method and device for reducing dark current in image sensors, the method and device disclosed herein can easily be integrated with current semiconductor processing techniques and equipment. Also, the method and structure disclosed herein may be implemented even as pixel size continues to shrink with emerging technologies.

What is claimed is:

1. An image sensor device, comprising:
a semiconductor substrate having a pixel area and a periphery region;
a light sensing element formed in the pixel region;
at least one transistor formed in the pixel region and the periphery region having a source/drain (S/D) region;
a portion of a dielectric layer formed over the light sensing element, wherein the portion of the dielectric layer is a remaining portion of the dielectric layer that has been etched back to form sidewall spacers on a gate electrode of the at least one transistor in the pixel and periphery region; and
a protective oxide layer formed over the portion of the dielectric layer.

2. The device of claim 1, wherein the light sensing element is selected from a group consisting of: a photodiode, pinned layer photodiode, photogate, and photo transistor.

3. The device of claim 1, wherein the at least one transistor is selected from a group consisting of: a transfer gate transistor, reset transistor, source follower transistor, row select transistor, nMOS transistor, pMOS transistor, and combinations thereof.

4. The device of claim 1, wherein the semiconductor substrate includes a silicon substrate and an epilayer.

5. The device of claim 1, further comprising:
a shallow trench isolation (STI) feature for isolating the pixel and periphery region;
a metal interconnection layer and interlayer dielectric formed on the semiconductor substrate;
a color filter aligned with the light sensing element in the pixel area; and
a microlens formed over the color filter.

6. An image sensor device, comprising:
a semiconductor substrate;
a pixel region formed in the semiconductor substrate, the pixel region comprising:
a first gate dielectric layer formed on the semiconductor substrate;
a first gate electrode formed on the first gate dielectric layer;
first sidewall spacers formed to cover sidewalls of the first gate electrode and the first gate dielectric layer;
a light sensing element;
a floating node;
a first portion of a dielectric layer formed over the light sensing element, wherein the first portion of the dielectric layer is a remaining portion of the dielectric layer that has been etched back to form at least the first sidewall spacers; and
a protective oxide layer formed over the first portion of the dielectric layer and the light sensing element and the floating node, the oxide protective layer also covering a portion of the first sidewall spacers;
a periphery region formed in the semiconductor substrate, the periphery region comprising:
a second gate dielectric layer formed on the semiconductor substrate;
a second gate electrode formed on the second gate dielectric layer;
second sidewall spacers formed to cover sidewalls of the second gate electrode and the second gate dielectric layer;
a second portion of the dielectric layer, the second portion of the dielectric layer being a remaining portion of the dielectric layer that has been etched back to form at least the second sidewall spacers; and
an isolation feature formed between the pixel region and the periphery region.

7. The device of claim 6, wherein the light sensing element is selected from a group consisting of: a photodiode, pinned layer photodiode, photogate, and photo transistor.

8. The device of claim 6, wherein the first and second gate electrodes formed on the first and second gate dielectric layers respectively form a first and second transistor and, wherein the first and second transistors are selected from a group consisting of: a transfer gate transistor, reset transistor, source follower transistor, row select transistor, nMOS transistor, pMOS transistor, and combinations thereof.

9. The device of claim 6, wherein the semiconductor substrate includes a silicon substrate and an epilayer.

10. The device of claim 6, further comprising:
a metal interconnection layer and interlayer dielectric formed on the semiconductor substrate;
a color filter aligned with the light sensing element in the pixel region; and
a microlens formed over the color filter.

11. The device of claim 6, further comprising lightly doped drain (LDD) regions formed in the pixel region and the periphery region.

12. The device of claim 11, wherein the protective oxide layer covers the LDD region formed in the pixel region.

13. An image sensor device, comprising:
a semiconductor substrate;
a pixel region formed in the semiconductor substrate, the pixel region comprising:
a first transistor formed on the semiconductor substrate;
first sidewall spacers formed to cover sidewalls of the first transistor;
a light sensing element;
a first portion of a dielectric layer formed over the light sensing element, wherein the first portion of the dielectric layer is a remaining portion of the dielectric layer that has been etched back to form at least the first sidewall spacers;
a protective oxide layer formed over the first portion of the dielectric layer, the light sensing element, and a portion of the first sidewall spacers; and
a first lightly doped drain (LDD) region;
a periphery region formed in the semiconductor substrate, the periphery region comprising:
a second transistor;
second sidewall spacers formed to cover sidewalls of the second transistor; and
a second portion of the dielectric layer, the second portion of the dielectric layer being a remaining portion of the dielectric layer that has been etched back to form at least the second sidewall spacers;
a second lightly doped drain (LDD) region; and
an isolation feature formed between the pixel region and the periphery region.

14. The device of claim 13, wherein the light sensing element is selected from a group consisting of: a photodiode, pinned layer photodiode, photogate, and photo transistor.

15. The device of claim 13, wherein the first and second transistors are selected from a group consisting of a transfer gate transistor, a reset transistor, source follower transistor, row select transistor, nMOS transistor, pMOS transistor, and combinations thereof.

16. The device of claim 13, further comprising:
a metal interconnection layer and interlayer dielectric formed on the semiconductor substrate;
a color filter aligned with the light sensing element in the pixel area; and
a microlens formed over the color filter.

17. The device of claim 13, wherein the protective oxide layer covers the LDD region formed in the pixel region.

18. The device of claim 13, further comprising a floating node formed in the pixel region.

* * * * *